(12) United States Patent
Li

(10) Patent No.: US 10,925,156 B2
(45) Date of Patent: Feb. 16, 2021

(54) CIRCUIT BOARD STRUCTURE AND DISPLAY PANEL

(71) Applicants: HKC Corporation Limited, Guangdong (CN); Chongqing HKC Optoelectronics Technology Co., Ltd., Chongqing (CN)

(72) Inventor: Wenxin Li, Guangdong (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 14 days.

(21) Appl. No.: 16/254,629

(22) Filed: Jan. 23, 2019

(65) Prior Publication Data

US 2020/0107432 A1    Apr. 2, 2020

Related U.S. Application Data

(63) Continuation of application No. PCT/CN2018/115866, filed on Nov. 16, 2018.

(30) Foreign Application Priority Data

Sep. 30, 2018    (CN) .................... 2018 2 1622255 U

(51) Int. Cl.
*H05K 1/00* (2006.01)
*H05K 1/02* (2006.01)
*H05K 1/14* (2006.01)

(52) U.S. Cl.
CPC ............. *H05K 1/028* (2013.01); *H05K 1/147* (2013.01)

(58) Field of Classification Search
CPC ................................ H05K 1/028; H05K 1/147
USPC .......................................................... 361/749
See application file for complete search history.

(56) References Cited

U.S. PATENT DOCUMENTS

| 10,537,047 B2 * | 1/2020 | Cheng ..................... H05K 1/115 |
| 2009/0126976 A1 * | 5/2009 | Iida ......................... H05K 1/028 174/254 |
| 2011/0255250 A1 * | 10/2011 | Dinh ....................... G03B 15/03 361/749 |
| 2014/0313402 A1 * | 10/2014 | Kim ...................... H04N 5/2253 348/373 |
| 2016/0316577 A1 * | 10/2016 | Yamamoto ............. G09G 5/006 |
| 2019/0074332 A1 * | 3/2019 | Kim ..................... H01L 51/0097 |
| 2019/0385547 A1 * | 12/2019 | Chen .................... G09G 3/3648 |

FOREIGN PATENT DOCUMENTS

| CN | 1856213 A | 11/2006 |
| CN | 101442878 A | 5/2009 |
| CN | 101836519 A | 9/2010 |
| CN | 206895005 U | 1/2018 |
| JP | 2010040720 A | 2/2010 |

* cited by examiner

*Primary Examiner* — Yuriy Semenenko

(57) ABSTRACT

The present disclosure provides a circuit board structure and a display panel, the circuit board structure includes mounting substrates and a flexible conductive substrate, and the flexible conductive substrate is connected between two adjacent mounting substrates to connect the two mounting substrates together.

18 Claims, 4 Drawing Sheets

CIRCUIT BOARD STRUCTURE AND DISPLAY PANEL

CROSS-REFERENCE TO RELATED APPLICATIONS

The present application is a Continuation Application of PCT Application No. PCT/CN2018/115866, filed Nov. 16, 2018, which claims the benefit of Chinese Patent Application No. 201821622255.1, filed Sep. 30, 2018, with the State Intellectual Property Office and entitled "circuit board structure and display panel", the entirety of which is hereby incorporated herein by reference.

FIELD

The exemplary embodiment of the present disclosure generally relates to the technical field of display, and more particularly relates to a circuit board structure, and a display panel.

BACKGROUND

Thin-film transistor liquid crystal display (TFT-LCD) is one of the main types of flat panel display and has become an important display platform in modern IT and video products. The main driving principle of TFT-LCD is as follows: the system board electrically connects red/green/blue compressed signals, control signals, and voltages to the controller on the printed circuit board (PCB) through wires, after the data is processed by a timing controller (TCON) integrated circuit on the PCB, then LCD may acquires the required power supply and signal through PCB and an electrical connection between a source-chip on film (S-COF) and a gate-chip on film (G-COF) and a panel display area, to display image information.

The LCD panel is formed by stacking a plurality of layers, the layers include an upper polarizing film, a color filter, a liquid crystal layer, a TFT glass substrate, and a lower polarizing plate arranged from top to bottom. The TFT glass substrate is plated with a layer of transparent conductive metal which can be indium tin oxide (ITO), ITO forms electrode wires on the glass substrate, the printed circuit forms a bonding areas on one side of the PCB, and the LCD panel can be powered after the electrode wires on the glass substrate electrically connects with the bonding area on the PCB.

The PCB in TFT-LCD is usually mounted with a power IC, and a driving IC, the power IC is configured to distribute power supply, and the driving IC is configured to drive S-COF and G-COF switches to change the state of liquid crystal in the liquid crystal layer, so that the LCD display screen can display images with various colors. Generally speaking, in the exemplary technology, the driving IC or the power IC must be integrated with other necessary electrical components on one PCB, but this will cause the length or width of the PCB to become very long, so that the whole LCD panel needs to reserve a large amount of plane space for PCB installation, thus it is not conducive to the design of the whole PCB.

SUMMARY

It is therefore one main object of the disclosure to provide a circuit board structure, which aims to solve the problem that the current circuit board occupies a large plane space.

In order to realize the above aim, the circuit board structure provided by the present disclosure is defined as a display panel which includes: at least two mounting substrates, configured to mount electrical component; and a flexible conductive substrate, defined between two adjacent mounting substrates to electrically connect with the two mounting substrates, and the flexible conductive substrate bends towards a side of its board surface to form a protruding part.

The present disclosure further provides a circuit board structure, which includes:

at least two mounting substrates, configured to mount electrical component; and a flexible conductive substrate, defined between two adjacent mounting substrates to electrically connect with the two mounting substrates, and the flexible conductive substrate bends towards a side of its board surface to form a protruding part, the protruding part includes a first bending section and a second bending section, one end of the first bending section electrically connects to one of the mounting substrates, and one end of the second bending section electrically connects to the other one of the mounting substrates, and the other ends of the first bending section and the second bending section connects to each other.

The present disclosure also provides a display panel which includes an array substrate, the array substrate includes:

at least two mounting substrates, configured to mount electrical component; and a flexible conductive substrate, defined between two adjacent mounting substrates to electrically connect with the two mounting substrates, and the flexible conductive substrate bends towards a side of its board surface to form a protruding part.

According to the technical solution of the present disclosure, the flexible conductive substrate is arranged between adjacent mounting substrates, so that when mounting the circuit board in the complete product, the flexible conductive substrate can bend, towards one side of the board surface where the flexible conductive substrate is located, to form a protruding part, so that the distance between adjacent mounting substrates can be shortened, and the function of the circuit board remains unchanged because the electrical components are mounted on the mounting substrates. Compared with the current circuit board structure, the circuit board structure provided by the present disclosure uses the flexible conductive substrate to replace the routing area on the original circuit board, to reduce the area occupied by the circuit board in the plane space by increasing the volume occupied by the flexible printed circuit board in three-dimensional space on the premise of ensuring the function of the circuit board, so that the complete product matched with the panel does not need to reserve a large amount of plane space, which is convenient for the design of the complete product.

BRIEF DESCRIPTION OF THE DRAWINGS

To better illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some embodiments according to this disclosure, and that those having ordinary skill in the art will be able to obtain other drawings based on the arrangements shown in these drawings without making inventive efforts.

FIG. 1 is a structural diagram of the circuit board structure of the present disclosure according to some embodiments.

Labels illustration for drawings.

| Label | Name | Label | Name |
|---|---|---|---|
| 1 | mounting substrate | 11 | bonding area |
| 2 | flexible conductive substrate | 21 | protruding part |
| 211 | first bending section | 212 | second bending section |
| 213 | horizontal section | 100 | circuit board structure |
| 200 | display panel | | |

The realization of the aim, functional characteristics, advantages of the present disclosure are further described specifically with reference to the accompanying drawings and embodiments.

DETAILED DESCRIPTION

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present invention without creative efforts shall fall within the protection scope of the present invention.

It is to be understood that, all of the directional instructions in the exemplary embodiments of the present disclosure (such as top, down, left, right, front, back) can only be used for explaining relative position relations, moving condition of the elements under a special form (referring to figures), and so on, if the special form changes, the directional instructions changes accordingly.

In addition, the descriptions, such as the "first", the "second" in the exemplary embodiment of present disclosure, can only be used for describing the aim of description, and cannot be understood as indicating or suggesting relative importance or impliedly indicating the number of the indicated technical character. Therefore, the character indicated by the "first", the "second" can express or impliedly include at least one character. In addition, the "and/or" in the present disclosure means including three paratactic solutions, for example, taking "A and/or B" as an example, the "A and/or B" includes A solution, B solution, or solution of A and B. In addition, the technical proposal of each exemplary embodiment can be combined with each other, however the technical proposal must base on that the ordinary skill in that art can realize the technical proposal, when the combination of the technical proposals occurs contradiction or cannot realize, it should consider that the combination of the technical proposals does not existed, and is not contained in the protection scope required by the present disclosure.

The present disclosure provides a circuit board structure 100.

Figure 1:
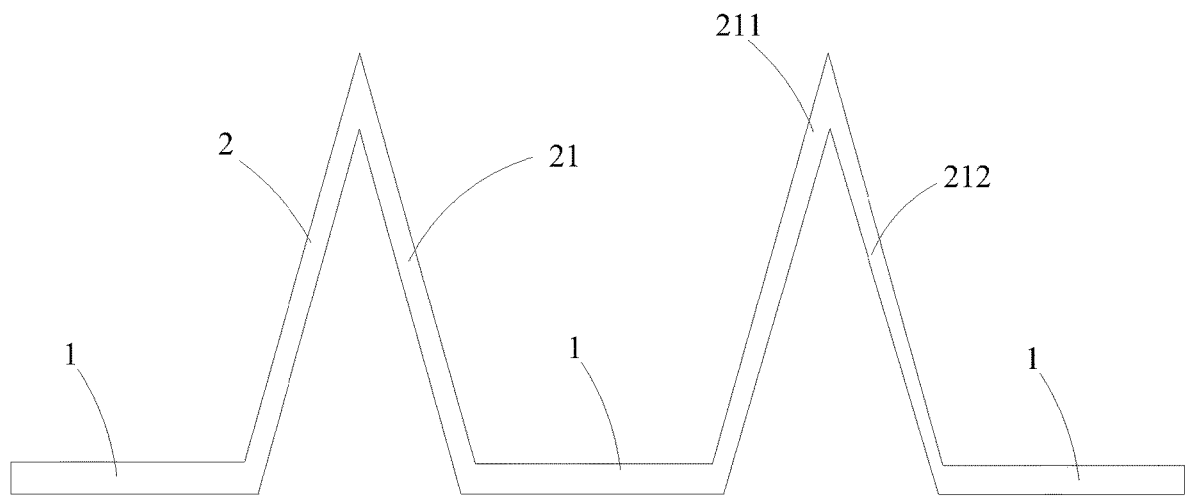

In the embodiments of the present disclosure, as shown in FIG. 1, the circuit board structure 100 includes at least two mounting substrates 1 and a flexible conductive substrate 2. The at least two mounting substrates 1 are configured to mount electrical component. The flexible conductive substrate 2 is defined between two adjacent mounting substrates 1 to electrically connect the two mounting substrates 1, and the flexible conductive substrate 2 bends towards a side of its board surface to form a protruding part.

According to the technical solution of the present disclosure, the flexible conductive substrate 2 is arranged between adjacent mounting substrates 1, so that when mounting the circuit board in the complete product, the flexible conductive substrate 2 can bend, towards one side of the board surface where the flexible conductive substrate 2 is located, to form a protruding part 21, so that the distance between adjacent mounting substrates 1 can be shortened, and the function of the circuit board remains unchanged because the electrical components are mounted on the mounting substrates 1. Compared with the current circuit board structure 100, the circuit board structure 100 provided by the present disclosure uses the flexible conductive substrate 2 to replace the routing area on the original circuit board, to reduce the area occupied by the circuit board in the plane space by increasing the volume occupied by the flexible printed circuit board in three-dimensional space on the premise of ensuring the function of the circuit board, so that the complete product matched with the panel does not need to reserve a large amount of plane space, which is convenient for the design of the complete product.

Furthermore, in the embodiments, there are a plurality of flexible conductive substrates 2, each of the flexible conductive substrates 2 bends towards one side of its board surface to define a protruding part 21, and the protruding parts 21 all protrude towards the same side of each mounting substrate 1.

The protruding parts 21 formed by the plurality of flexible mounting substrates 1 protrude towards the same side of each mounting substrate 1. Since the present disclosure shortens the distance between adjacent mounting substrates 1 through the deformation of the flexible mounting substrates 1 in the vertical direction, to reduces the plane space occupied by the circuit board. Therefore, when the protruding parts 21 all protrude towards the same side of each mounting substrate 1, it only need to reserve only a certain space on one side of each mounting substrate 1 to accommodate the protruding parts of the flexible conductive substrate 2 when designing a complete machine matched with the display panel 200, it is advantageous to make the complete machine thin, and compared with an exemplary circuit board, the circuit board provided by the present disclosure occupies less space, which is advantageous to make the complete machine narrow, combing the two advantages the complete machine can be narrow and thin which conforms to mainstream aesthetic of the current market, it is conducive to the publicity and sales of products.

It should be noted that in the embodiments, the plane of each mounting substrate 1 is parallel to the horizontal plane, while the vertical direction is perpendicular to the plane of each mounting substrate 1 and is not limited to the direction perpendicular to the horizontal plane, that is, when the plane of each mounting substrate 1 changes, the vertical direction changes accordingly.

It should be noted that in other embodiments, the plurality of protruding parts 21 may not protrude towards the same side of each mounting substrate 1. Due to the different positioning of products and the different internal structures of products, although the thickness of the complete product manufactured and sold will be thicker than that of the complete product with the protruding parts towards the same side of each mounting substrate 1, more space may contribute to the heat dissipation of each mounting substrate 1, and the influence of temperature on the performance of the electrical components on the mounting substrates 1 is reduced, thus ensuring the stability of product operation, and it can be set as a product with higher requirements on product performance.

Furthermore, the protruding part 21 includes a first bending section 211 and a second bending section 212, one end of the first bending section 211 electrically connects to one of the mounting substrates 1, and one end of the second bending section 212 electrically connects to the other one of the mounting substrates 1, and the other ends of the first bending section 211 and the second bending section 212 connects to each other.

Since the protruding part 21 is formed by bending the flexible guide substrate, the protruding part 21 is provided to include the first bending section 211 and the second bending section 212, so that the shape of the protruding part 21 can be easily molded. In the actual production process, in order to make the complete product smaller and thinner, the space inside the complete product is very precious, so the structure inside the complete product would also be very compact. Therefore, when the circuit board is placed in the complete product, since the protruding part 21 is formed by the flexible conductive substrate 2, the protruding part 21 is easily deformed by the compression of other structures in the complete product, which may cause the physical properties of the protruding part 21 to be affected. As the use time increases, the conductive ability of the flexible conductive substrate 2 may be affected, resulting in product failure and shortening the service life of the product. Due to the fact that in the operation process the electrical components on the mounting substrates 1 would generate heat due to operation and need the auxiliary heat dissipation of the circuit board, if the protruding part 21 is pressed against the mounting substrates 1, not only the heat dissipation capability of the circuit board is affected, resulting in the performance of the electrical components being reduced, and resulting in the degradation of the product performance and affecting the user experience, but also the elastic force applied to the connections between the flexible conductive substrate 2 and the mounting substrates 1 may be increased, which may reduce the sensitivity of the connection between the flexible conductive substrate 2 and the mounting substrates 1, resulting in the failure of good transmission of voltage signals, and resulting in the damage to the product and also affecting the user experience.

Therefore, by setting the protruding part 21 to include the first bending section 211 and the second bending section 212, the inclined angles of the first bending section 211 and the second bending section 212 with respect to the mounting substrates 1 can be adjusted, and the respective lengths of the first bending section 211 and the second bending section 212 can also be adjusted, so that the protruding part 21 can well avoid other structures in the complete product when the protruding part 21 are in the complete product, thereby avoiding the above problems, and reducing the failure rate of products, the user experience and product reputation are improved, and the sales of products are facilitated.

Furthermore, the first bending section 211 and the second bending section 212 are equal in length, and the inclination angles of the first bending section 211 and the second bending section 212 are also equal.

The first bending section 211 is set to be the same as the second bending section 212 in length. One reason is that the first bending section 211 and the second bending section 212, which are set to be the same length, can facilitate designers to calculate the space occupied by the protruding part 21 and facilitate the design of the complete product when designing the size of the complete product. Another reason is that in the production process, not only the equipment for manufacturing the protruding part 21 can be simpler, but also the protruding parts 21 are easier to form, which is conducive to controlling the manufacturing cost of the circuit board. And, the inclination angles of the first bending section 211 and the second bending section 212 are equal, so that the first bending section 211 and the second bending section 212 can be approximately regarded as the two sides of an isosceles triangle, so that the calculation of the height and volume of the protruding part 21 is simpler without complicated calculation.

Moreover, since the first bending section 211 and the second bending section 212 are obliquely arranged, and ends of the first bending section 211 and the second bending section 212 away from the mounting substrates 1 are connected to each other. The first bending section 211, the second bending section 212 and the plate surface of the flexible conductive substrate 2 form a triangular prism, the triangular prism has higher stability than other shapes. In the process of assembly of the complete product, if the protruding part 21 is interfered by external forces, such as when a worker mistakenly operates to squeeze the protruding part 21 by hand or other structures, the triangular prism structure can ensure that the protruding part 21 has a certain anti-pressure ability, and the protruding part 21 does not deform easily to be damaged, the error-tolerant rate in the assembly process of the complete product is improved.

In the process of transportation and use of the complete product, the stable triangular prism structure can make the probability of deformation of the protruding part 21 under the influence of external force lower, and can ensure the shape of the protruding part 21 unchanged for a long time, the repair rate of the product is reduced, and the stability of the product is improved.

It will be understood that in other embodiments, the lengths of the first bending section 211 and the second bending section 212 may not be equal to each other, so as to be arranged in different products. And accordingly, the inclination angles of the first bending section 211 and the second bending section 212 may also be different, so as to be suitably arranged in different overall structures. Moreover, since the internal structure of the complete product is relatively complex, the lengths of the first bending section 211 and the second bending section 212 of the different protruding parts 21 may also be different, and the inclination angles of the corresponding first bending section 211 and the second bending section 212 may also be changed to more closely fit the internal structure of the complete product and to reduce the volume of the complete product. In some embodiments, the structures of all the protruding parts 21 formed by flexible printed circuit boards are the same.

Furthermore, the inclination angle of the first bending section 211 has a range of 45 degrees to 70 degrees. That is, the inclination angle of the second bending section 212 also has a range of 45 degrees to 70 degrees.

Since the shortening of the distance between the adjacent mounting substrates 1 is related to the height of the protruding part 21, that is, the larger the inclination angle of the first bending section 211, the shorter the distance between the two mounting substrates 1. When the inclination angle of the first bending section 211 is 90 degrees, the two adjacent mounting substrates 1 are closely attached. Although the area occupied by the circuit board in the complete product is the smallest in this way, since the mounting substrates 1 need to have good heat dissipation performance to assist the electrical components on the mounting substrates 1 to dissipate heat, sufficient space needs to be reserved between the two mounting substrates 1 to ensure the heat dissipation capacity of the mounting substrates 1. Moreover, with the increase of the inclination angle of the first bending section 211, the distance between the first bending section 211 and the second bending section 212 may gradually shorten until it is completely attached. Since the electrode lines are etched on the flexible conductive substrate 2, when the flexible conductive substrate 2 is bent, the electrode lines on the flexible conductive substrate 2 may also be bent accordingly. With the increase of the inclination angle of the first bending section 211, the electrode lines on the flexible conductive substrate 2 may be excessively bent, thus affecting the conductivity of the electrode lines. Therefore, the inclination angle of the first bending section 211 should not be set too large.

Secondly, when the inclination angle of the first bending section 211 is set too small, the distance between the two adjacent mounting substrates 1 is shortened by a limited amount, and the plane space occupied by the circuit board in the complete product cannot be effectively reduced, thus weakening the circuit board effect provided by the present disclosure. Therefore, the inclination angle of the first bending section 211 should not be set too small.

Therefore, setting the inclination angle range of the first bending section 211 to 45 degrees to 70 degrees is the result of a comprehensive consideration, which can ensure the heat dissipation capability of the mounting substrates 1 and the conductive capability of the flexible conductive substrate 2 while reducing the plane space occupied by the circuit board.

Specifically, in the embodiments, the inclination angle of the first bending section 211 is set to 60 degrees, so that the distance between the two mounting substrates 1 can be effectively shortened, the occupied space of the circuit board can be reduced, and the protruding part 21 does not occupy too much vertical space, which is beneficial to the thinning design of the complete product. In other embodiments, the inclination angle of the first bending section 211 may also be set to 45 degrees, 50 degrees, 55 degrees, 65 degrees, 70 degrees, etc.

Furthermore, a crease is formed at the joint of the first bending section 211 and the second bending section 212.

Since the protruding part 21 is formed by bending the flexible conductive substrate 2, the protruding part 21 is the deformed portion of the flexible conductive substrate 2 and may apply elastic restoring force to two sides of the protruding part 21, while the elastic restoring force generated by the protruding part 21 is set at the connections between the flexible conductive substrate 2 and the mounting substrates 1. As the flexible conductive substrate 2 and the mounting substrates 1 are bonded and fixed by a kind of anisotropic conductive adhesive, the elastic restoring force of the protruding part 21 may cause the flexible conductive substrate 2 and the mounting substrates 1 to shift with time, so that voltage signals cannot be well transmitted through the flexible conductive substrate 2, such the product mat be damaged. However, the crease formed between the first bending section 211 and the second bending section 212 can effectively weaken the elastic restoring force of the protruding part 21, further weaken the drag on the connections between the flexible conductive substrate 2 and the mounting substrates 1, and the stability of the connection between the flexible conductive substrate 2 and the mounting substrates 1 is improved.

It should be noted that in other embodiments, no crease may be formed between the first bending section 211 and the second bending section 212. In order to improve the stability of the connections between the flexible conductive substrate 2 and the mounting substrates 1, limits may be provided on two sides of the protruding part 21 to reduce the influence of the elastic restoring force of the protruding part 21 on the connections between the flexible conductive substrate 2 and the mounting substrates 1. Specifically, the first bending section 211 and the second bending section 212 can be brought into contact with different limit structures by providing corresponding limit structures such as limit posts and limit plates on the complete product, thereby weakening the elastic restoring force of the protruding part 21. Also, during assembly, the protruding part 21 may be inserted into a corresponding groove provided on the complete product, the groove may be formed by other structures on the complete product, or may be formed on the shell of the complete product, and the first bending section 211 and the second bending section 212 may be limited by the groove wall of the groove, thereby limiting the elastic restoring force of the protruding part 21. Or by adding fasteners between the flexible conductive substrate 2 and the mounting substrates 1, the stability of the connections between the flexible conductive substrate 2 and the mounting substrates 1 can be improved, the fastener can be screw, spring nail, etc.

Figure 2:
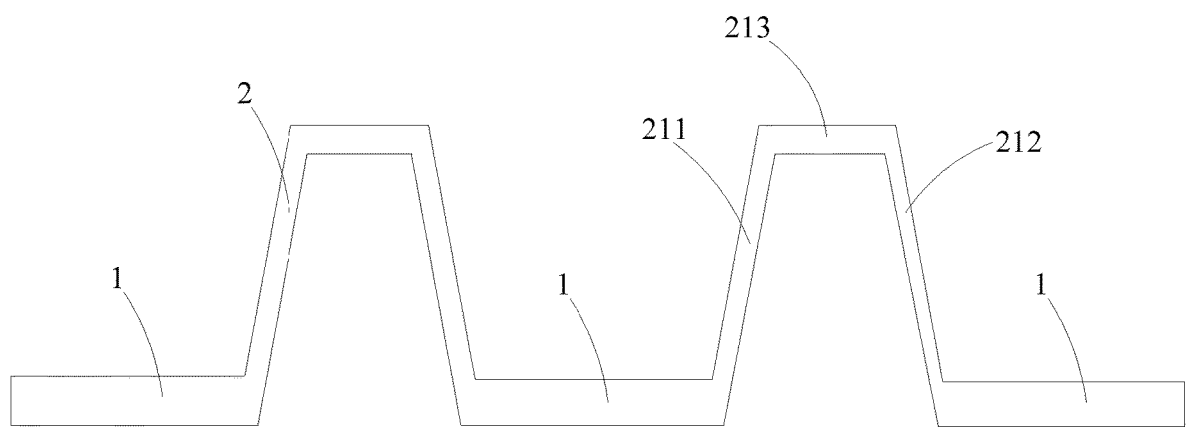
FIG. 2 is a structural diagram of the circuit board structure of the present disclosure according to some embodiments.

Furthermore, as shown in FIG. 2, in one embodiment of the present disclosure, the flexible conductive substrate 2 also includes a horizontal section 213, two sides of the horizontal section 213 are connected to the first bending section 211 and the second bending section 212, and the horizontal section 213 is parallel to the mounting substrates 1.

The horizontal section 213 is arranged on the sides of the first bending section 211 and the second bending section 212 away from the mounting substrates 1, and the first bending section 211 and the second bending section 212 are obliquely arranged, so that the board surfaces of the first bending section 211, the second bending section 212, the horizontal section 213, and the flexible conductive substrate 2 itself can be approximately regarded as a ladder. In order to ensure the heat dissipation capacity of the mounting substrates 1, although the distance between two adjacent mounting substrates 1 is shortened, there is still a certain distance. Through the arrangement of the horizontal section 213, the height of the protruding part 21 relative to the mounting substrates 1 can be reduced, thereby reducing the occupied space of the protruding part 21 and facilitating the thinning of the complete product.

Furthermore, creases are formed between the first bending section 211 and the horizontal section 213, and between the second bending section 212 and the horizontal section 213. The presence of creases can weaken the elastic restoring force of the protruding part 21 to improve the stability of the connections between the flexible conductive substrate 2 and the mounting substrates 1. Due to the arrangement of the horizontal section 213, the overall structure of the protruding part 21 is more gentle, thereby weakening the elastic restoring force of the protruding part 21 and also improving the stability of the connections between the flexible conductive substrate 2 and the mounting substrates 1.

It should be noted that in another embodiment of the present disclosure, the horizontal section 213 may not be parallel to the mounting substrates 1, and the horizontal section 213 may also be arranged in an arc shape to smooth the transition between the horizontal section 213 and the first bending section 211, and between the horizontal section 213 and the second bending section 212, to reduce the influence on the electrode lines on the flexible conductive substrate 2.

Figure 3:
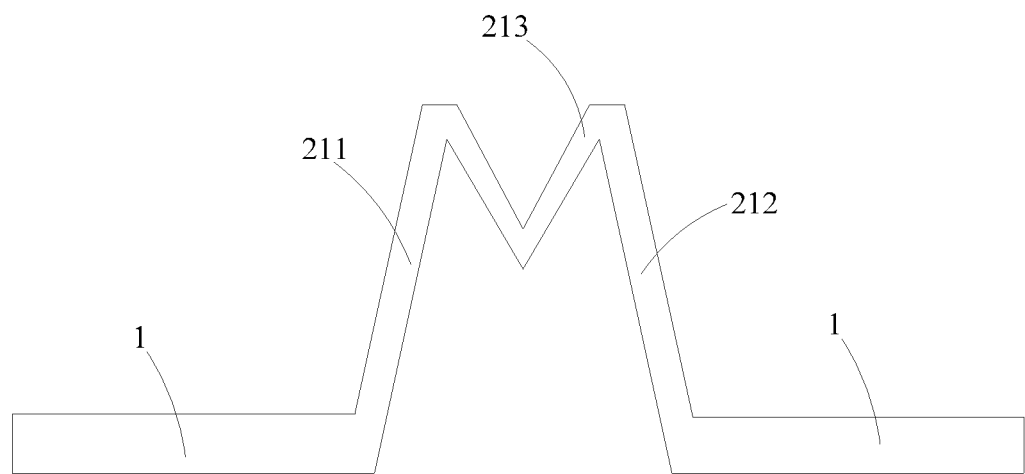
FIG. 3 is a structural diagram of the circuit board structure of the present disclosure according to some embodiments.

As shown in FIG. 3, in one of the embodiments of the present disclosure, the horizontal section 213 may also be arranged in a V-shape, and the horizontal section 213 protrudes towards the side where each mounting substrate 1 is located. Compared with the horizontal section 213 arranged parallel to the mounting substrates 1, setting the horizontal section 213 in the V shape has the advantages that the height of the protruding part 21 can be reduced, and the plane space occupied by the horizontal section 213 is smaller and the application range is wider.

Figure 4:
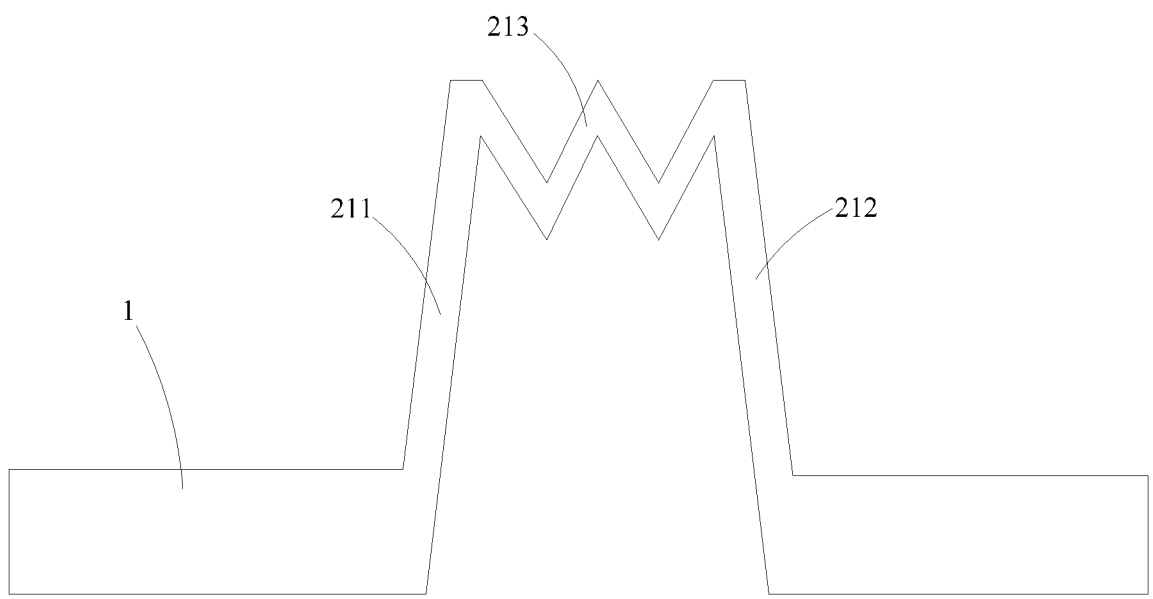
FIG. 4 is a structural diagram of the circuit board structure of the present disclosure according to some embodiments.

As shown in FIG. 4, in one embodiment of the present disclosure, the horizontal section 213 may also be arranged in a wave shape. Through the continuous bending of the horizontal section 213, the plane space occupied by the horizontal section 213 can be effectively reduced to suit the requirements of different products. since the horizontal section 213 is continuously bent, it is suitable for being arranged in larger products.

Figure 5:
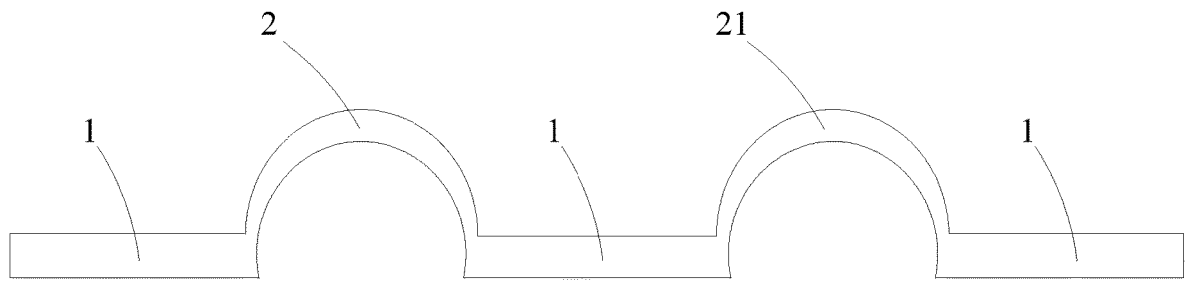
FIG. 5 is a structural diagram of the circuit board structure of the present disclosure according to some embodiments.

Furthermore, as shown in FIG. 5, in one embodiment of the present disclosure, the protruding parts 21 are arranged in a curved shape.

The advantage of the protruding arc-shaped arrangement of the protruding part 21 is that the flexible conductive substrate 2 has a relatively small influence on the electrode lines on the flexible conductive substrate 2 as there are less bending sections in the flexible conductive substrate 2, such the conductive performance of the flexible conductive substrate 2 is more stable.

Secondly, due to the deformable nature of the flexible conductive substrate 2, the protruding part 21 has the ability to deform accordingly. When the protruding part 21 is pressed by other structures of the complete product, the curved surface of the protruding part 21 does not have sharp portions, which can reduce the damage to the protruding part 21, and the structure of the circular arc is easy to transmit force. When one side or a certain area of the protruding part 21 is pressed, the protruding part 21 can deform further to improve the stability of the protruding part 21.

Moreover, considering the processing difficulty, the flexible conductive substrate 2 can form the protruding parts 21, arranged in convex arcs, only by bringing the adjacent mounting substrates 1 close to each other, without applying other operations to the flexible conductive substrate 2. Therefore, the protruding parts 21 arranged in convex arcs are easy to be manufactured, and it is facilitate to product and manufacture in large-scale.

Figure 6:
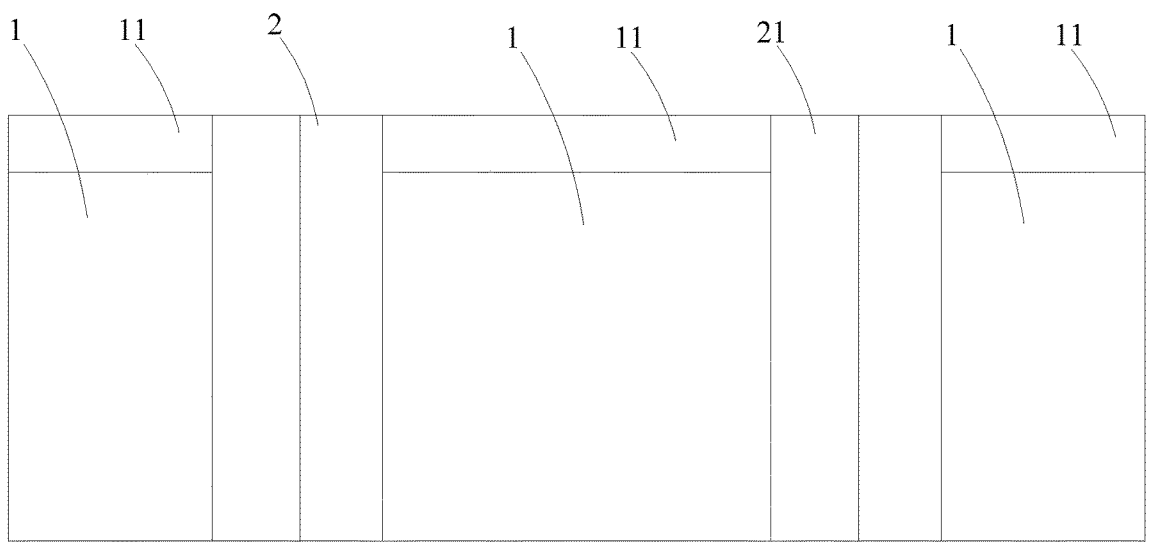
FIG. 6 is a top plan view of the embodiment shown in FIG. 1.
Figure 7:
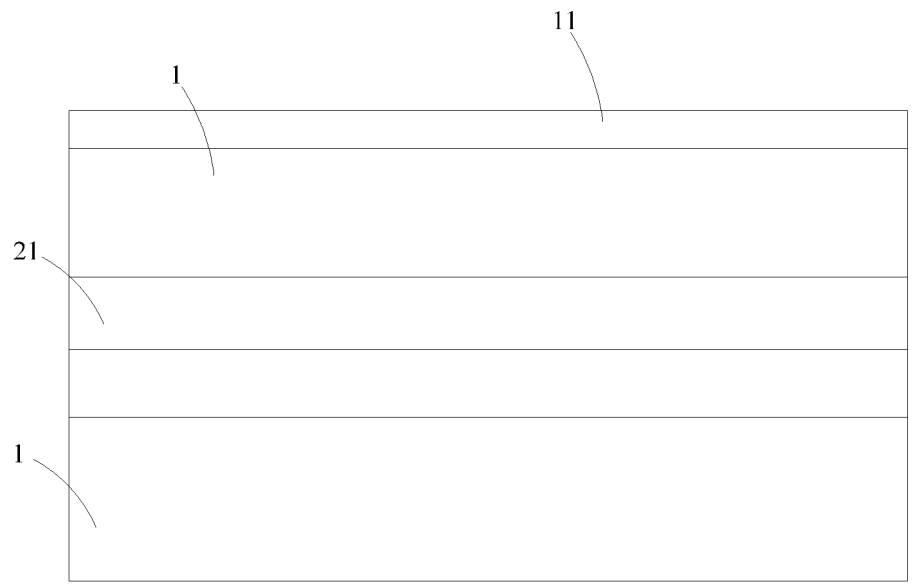
FIG. 7 is a top plan view of the circuit board structure of the present disclosure according to some embodiments.
Figure 8:
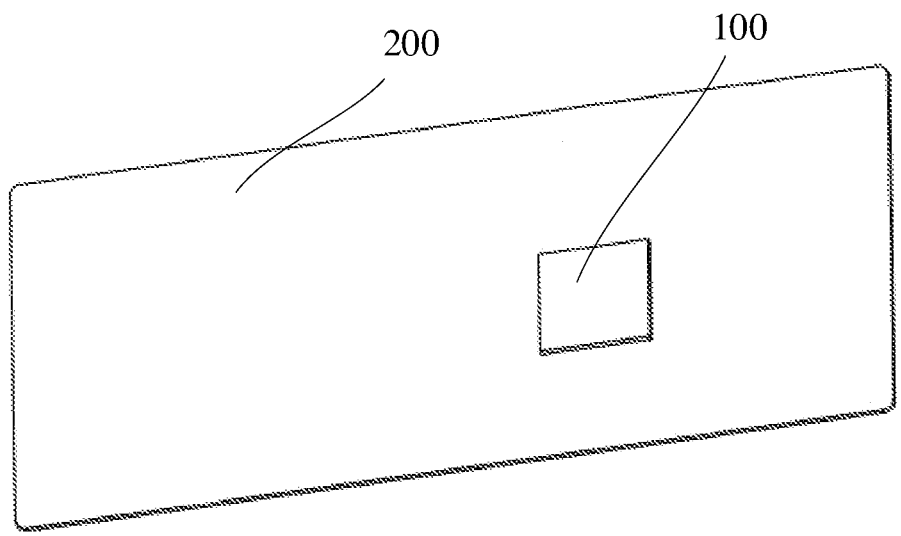
FIG. 8 shows a display panel of the present disclosure according to some embodiments.

Referring to FIGS. 6 and 7, the flexible conductive substrate 2 is provided on the opposite sides or adjacent sides of the bonding areas 11 of the mounting substrates 1.

In the embodiment shown in FIG. 1, the flexible conductive substrate 2 is disposed on the adjacent sides of the bonding area 11 of each mounting substrate 1, and in the embodiment shown in FIG. 6, the flexible conductive substrate 2 is disposed on the opposite sides of the bonding areas 11 of the mounting substrates 1. In the actual production process, due to different product types, the position of the flexible conductive substrate 2 can be adaptively changed to minimize the plane space occupied by the conductive substrate.

Furthermore, the flexible conductive substrate 2 is made of flexible printed circuit board.

Flexible printed circuit board (FPC) is a printed circuit board with highly reliability and excellent flexibility made of polyimide or polyester film. It has the characteristics of high wiring density, light weight, thin thickness and good flexibility.

The present disclosure also provides a display panel 200 which includes a circuit board structure 100, and the specific structure of the circuit board structure 100 refers to the above embodiments. As the display panel 200 adopts all the technical proposals of the above exemplary embodiments, the display panel 200 at least has all of the beneficial effects of the technical proposals of the above exemplary embodiments, no need to repeat again.

Specifically, in the field of display panels, the printed circuit board (PCB) is generally divided into C-board and X-board, where C-board is mainly responsible for receiving input signals from the system end and outputting data signals and control signals, and X-board is mainly responsible for transmitting data signals and control signals outputted from C-board. According to different products, C-board and X-board can be respectively arranged on two PCBs or integrated on one PCB. With current technology, when C-board and X-board are integrated on one PCB, the PCB may become very long. According to the display panel 200 provided by the present disclosure, through the above circuit board structure 100, when the C-board and the X-board are integrated on one PCB, the PCB can be narrowed or shortened, the space occupied by the PCB is reduced, and the design of the complete product is convenient.

The foregoing description merely depicts some embodiments of the present application and therefore is not intended to limit the scope of the application. An equivalent structural or flow changes made by using the content of the specification and drawings of the present application, or any direct or indirect applications of the disclosure on any other related fields shall all fall in the scope of the application.

What is claimed is:

1. A circuit board structure, wherein the circuit board structure comprises:
   at least two mounting substrates, configured to mount electrical component; and
   a flexible conductive substrate, defined between two adjacent mounting substrates to electrically connect with the two mounting substrates, and the flexible conductive substrate bends towards a side of its board surface to form a protruding part;
   wherein the protruding part comprises a first bending section and a second bending section, the first bending section, the second bending section and a plate surface of the flexible conductive substrate form a triangular prism, and an inclination angle of the first bending section has a range of 45 degrees to 70 degrees.

2. The circuit board structure according to claim 1, wherein the circuit board structure comprises a plurality of the flexible conductive substrates, each of the flexible conductive substrates defines the protruding part, and the protruding parts all protrude towards a same side of the mounting substrate.

3. The circuit board structure according to claim 1, wherein the circuit board structure comprises a plurality of the flexible conductive substrates, each of the flexible conductive substrates defines the protruding part, and the plurality of protruding parts protrude towards different direction.

4. The circuit board structure according to claim 1, wherein one end of the first bending section electrically connects to one of the mounting substrates, and one end of the second bending section electrically connects to the other one of the mounting substrates, and the other ends of the first bending section and the second bending section connects to each other.

5. The circuit board structure according to claim 4, wherein the first bending section and the second bending section are equal in length, and inclination angles of the first bending section and the second bending section are equal.

6. The circuit board structure according to claim 1, wherein the inclination angle of the first bending section is set to be 60 degrees.

7. The circuit board structure according to claim 4, wherein a crease is formed at the joint of the first bending section and the second bending section.

8. The circuit board structure according to claim 4, wherein the flexible conductive substrate further comprises a horizontal section, two sides of the horizontal section respectively connect with the first bending section and the second bending section, and the horizontal section is parallel to the mounting substrate.

9. The circuit board structure according to claim 8, wherein creases is formed between the horizontal section and the first bending section, and between the horizontal section and the second bending section.

10. The circuit board structure according to claim 1, wherein the protruding part is in a protruding arc shape.

11. The circuit board structure according to claim 1, wherein the flexible conductive substrate is made of a flexible printed circuit board.

12. The circuit board structure according to claim 1, wherein the flexible conductive substrate is defined at opposite sides or adjacent sides of bonding areas of the mounting substrates.

13. A circuit board structure, wherein the circuit board structure comprises:
    at least two mounting substrates, configured to mount electrical component; and
    a flexible conductive substrate, defined between two adjacent mounting substrates to electrically connect with the two mounting substrates, and the flexible conductive substrate bends towards a side of its board surface to form a protruding part, the protruding part comprises a first bending section and a second bending section, one end of the first bending section electrically connects to one of the mounting substrates, and one end of the second bending section electrically connects to the other one of the mounting substrates, and the other ends of the first bending section and the second bending section connects to each other, the first bending section, the second bending section and a plate surface of the flexible conductive substrate form a triangular prism, and an inclination angle of the first bending section has a range of 45 degrees to 70 degrees.

14. A display panel, wherein the display panel comprises an array substrate, the array substrate comprises:
    at least two mounting substrates, configured to mount electrical component; and
    a flexible conductive substrate, defined between two adjacent mounting substrates to electrically connect with the two mounting substrates, and the flexible conductive substrate bends towards a side of its board surface to form a protruding part;
    wherein the protruding part comprises a first bending section and a second bending section, the first bending section, the second bending section and a plate surface of the flexible conductive substrate form a triangular prism, and an inclination angle of the first bending section has a range of 45 degrees to 70 degrees.

15. The display panel according to claim 14, wherein one end of the first bending section electrically connects to one of the mounting substrates, and one end of the second bending section electrically connects to the other one of the mounting substrates, and the other ends of the first bending section and the second bending section connects to each other.

16. The display panel according to claim 15, wherein the first bending section and the second bending section are equal in length, and inclination angles of the first bending section and the second bending section are equal.

17. The display panel according to claim 15, wherein a crease is formed at the joint of the first bending section and the second bending section.

18. The display panel according to claim 14, wherein the flexible conductive substrate is defined at opposite sides or adjacent sides of bonding areas of the mounting substrates.

* * * * *